United States Patent [19]

Pommer

[11] 4,061,891

[45] Dec. 6, 1977

[54] TEST INSTRUMENT FOR DETERMINING APPARENT POWER CONSUMPTION AND GROUND FAULTS IN VARIOUS PORTIONS OF A DISTRIBUTED-LOAD, CONSTANT VOLTAGE AUDIO DISTRIBUTION SYSTEM

[76] Inventor: Wayne A. Pommer, 475 Mount Hood Drive SW., Issaquah, Wash. 98027

[21] Appl. No.: 769,387

[22] Filed: Feb. 16, 1977

[51] Int. Cl.² ............................................. H04R 29/00
[52] U.S. Cl. ............................. 179/175.1 A; 179/175; 324/142
[58] Field of Search ......... 179/175.1 A, 175, 175.3 R; 324/103 R, 142; 328/173

[56] References Cited

U.S. PATENT DOCUMENTS

| | | | |
|---|---|---|---|
| 3,947,762 | 3/1976 | Hug | 324/142 |
| 3,959,724 | 5/1976 | Chana et al. | 324/142 |
| 3,989,908 | 11/1976 | Budrys et al. | 178/175.1 A |
| 3,997,724 | 12/1976 | Seebinger | 179/175.1 A |

*Primary Examiner*—Douglas W. Olms
*Attorney, Agent, or Firm*—David H. Deits; Roy E. Mattern, Jr.; Kenneth S. Kessler

[57] ABSTRACT

To determine apparent power consumption in a distributed-load, constant voltage audio distribution system, a test instrument is provided which is substituted for the amplifier in the system during the test. A constant, known AC test voltage at a convenient audio frequency is applied to the distribution system or a portion thereof. The resultant AC current passing through the distribution system is measured and read on a meter calibrated directly in watts. The apparent power consumed in the system is directly proportional to the current. The instrument is provided with an internal audio frequency oscillator as a test signal source with a provision for bypassing it so that an external oscillator may be utilized. The oscillator signal is processed by a voltage controlled amplifier and a power amplifier wherein the signal level is controlled. The processed test signal is applied to the system under test. The voltage across a resistance in series with the tested circuit is monitored through an isolating buffer. A summing amplifier connected to the buffer through an AC to DC converter has additional variable DC inputs to permit the zero adjustment and load nulling on the indicating meter connected to the output of the summing amplifier. An overload indication circuit monitors the signal applied to the meter to provide a signal indicating that another value of resistance in series with the tested circuit should be selected. A feed back loop provides a signal controlling the level of the test signal.

18 Claims, 10 Drawing Figures

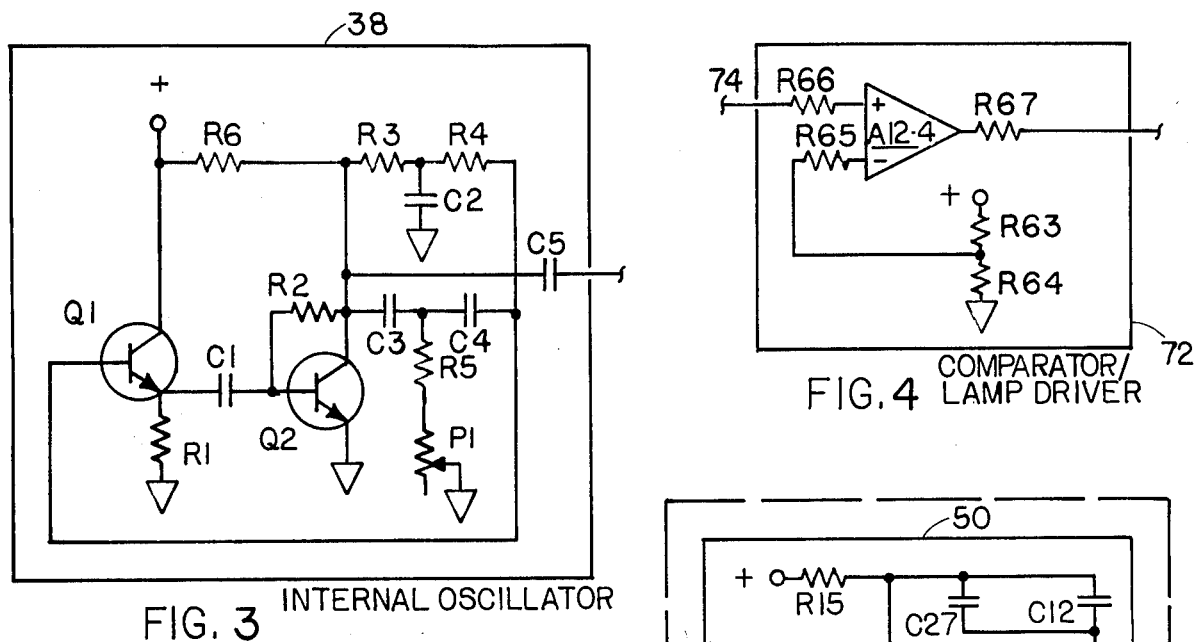
FIG. 3 INTERNAL OSCILLATOR
FIG. 4 COMPARATOR/LAMP DRIVER
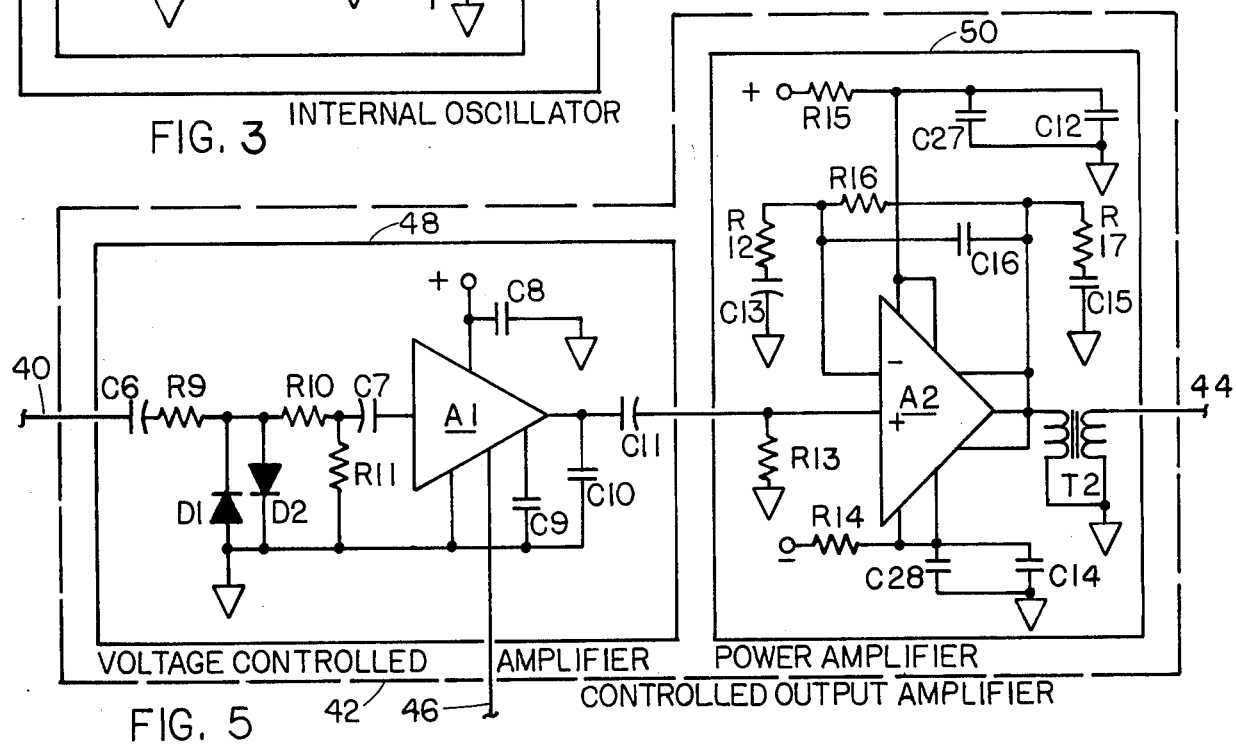
FIG. 5 VOLTAGE CONTROLLED AMPLIFIER | POWER AMPLIFIER
CONTROLLED OUTPUT AMPLIFIER
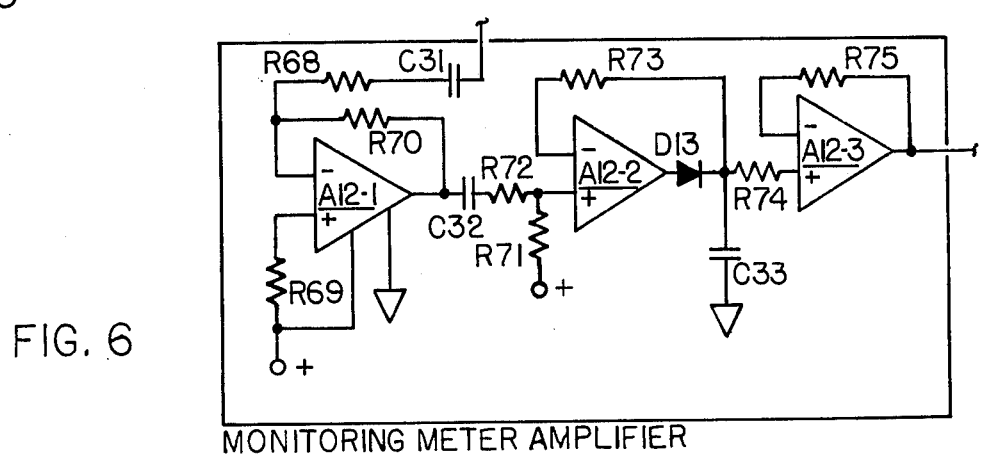
FIG. 6 MONITORING METER AMPLIFIER

TEST INSTRUMENT FOR DETERMINING APPARENT POWER CONSUMPTION AND GROUND FAULTS IN VARIOUS PORTIONS OF A DISTRIBUTED-LOAD, CONSTANT VOLTAGE AUDIO DISTRIBUTION SYSTEM

BACKGROUND OF THE INVENTION

In large audio systems such as those used in schools, auditoriums, airports, hospitals, and athletic stadiums, the electrical energy to drive speakers is distributed much in the same fashion as ordinary electric power. The output voltage from the power amplifier although the amplitude will vary is considered or assumed to be a constant voltage similar to common 120 volt AC lines which we find in our homes except that the frequency is varied in such audio systems. Many amplifiers used for this purpose have constant-voltage output taps for the industry standardized values of 25, 70, and perhaps 140 volts, as well as the standard impedance taps. The voltage value of the amplifier, and hence the system, is the RMS output voltage of the amplifier when it is driven to full power by a sine wave, and with a load connected to the amplifier. The constant-voltage taps correspond to impedance taps, typically at the output transformer secondary, by:

$$\text{Impedance tap} = \frac{(\text{Constant Voltage Value})^2}{\text{Maximum Amplifier Power}}$$

It can therefore be seen that, for example, for a 25 volt system and a 10 watt amplifier the required constant voltage tap would occur at 62.5 ohms, given the same situation but with a 100 watt amplifier, the same 25 volt tap would be placed at 6.25 ohms.

Amplifiers used in constant-voltage systems generally incorporate substantial negative-feedback to insure that variations in load will have virtually no effect on the output voltage of the amplifier. The speakers are designed to accept this nominally constant voltage from the amplifier and differ from each other essentially only in power consumed, such as a 100-watt and a 300-watt-light bulb do, as the electric power analogy is again used. There are several important advantages to this method of audio distribution. First, by using a relatively high line voltage, power loss in the wire between the amplifier and the load is minimized, even when using wires of relatively small size. For example, while an 8-ohm speaker can only be 70 feet from the amlifier to suffer a 10% power loss with a connecting cable size of #18 AWG, a 1-watt speaker in a 70 V system can be over 17,000 feet from the amplifier with the same loss with a wire size of #22 AWG; 2 ½ times smaller than #18. Calculations are simplified in the constant-voltage system also. Instead of being required to perform a series of tedious, involved calculations to determine impedances in numerous series and parallel branches, or trying to devise a hookup given various speaker impedances and sound level requirements to match a particular output impedance tap on an amplifier, one may simply parallel speakers as necessary and add wattages of individual speakers to obtain the total power of the system, in watts.

In practice, the speaker load consists of one or more speakertransformer combinations. The speaker is of a conventional design, with conventional voice coil impedance; usually 4, 8 or 16 ohms. The transformer is designed to work into this impedance and the primary side of the transformer accepts the line level voltage - 25, 70, or 140 volts. The primary usually has taps, and these are calibrated in watts, the ratings of which are only valid for a system voltage for which the transformer is designed. For other system voltages, the transformer will work, but at a proportionately differenct power level.

Even though determination of total power utilized in a system is simplified for the system designer, an actual installation may present difficulties for the installer or the serviceman called to install a system or repair an existing installation which may have been modified by unskilled personnel.

Occasionally a transformer will develop a short, for example, if a mounting screw penetrates the windings. A voice coil may open. Perhaps a transformer is connected backwards, to the wrong tap, or is not connected at all. One leg of the distribution line may short to ground and the other leg also short to ground in a totally different part in the system; taken together they will short out the amplifier. A speaker with the wrong voice coil impedance or a transformer designed for the wrong voltage may be used. These potential problems are multiplied by the use of several hundred speakers in a large installation. There are even occasions where the system voltage is unknown.

In the past, servicemen have relied on DC resistance checks with a conventional ohmmeter, virtually worthless in a system designed to transmit audio signals. DC resistance from the line and transformer primaries may vary widely and are so close to zero any degree of accuracy is totally nonexistant. Some servicemen have also used impedance bridges which are time-consuming to null, and then converting the impedance found into power consumed given a constant voltage. Again very time consuming—especially in view of the many circuits which must be checked. This instrument described may be used in place of the central power amplifier, across individual speaker lines, tracing problem lines throughout the complex all the way to the speaker itself, measuring power consumption of the connected load. This unit needs no nulling and reads out directly in watts, and also features impedance scales which may be used regardless of whether the sound system is of the constant-voltage type or of the more familiar form of parallel or series-parallel speaker systems.

The unit may likewise be used to check how various network's input impedance varies with frequency when used with the external oscillator, such as filters, pads, attenuators, crossover networks, speakers, etc. The feature of no nulling permits a very fast analysis.

The low voltage used for testing the system permits analysis of the system under normal circumstances, that is, with people present — school occupied, with people seated in an auditorium, etc. There is no need to run a full-voltage signal for a complete check.

SUMMARY OF THE INVENTION

In constant-voltage audio distribution systems the apparent power consumed, i.e. the product of the magnitude of the current and voltage, is of major importance. The apparent power, although normally close in magnitude to the actual power consumed because the loads are principally resistive, more closely indicates the load on an audio amplifier for such a system.

To measure the apparent power an AC signal at a convenient audio frequency is applied to the load or line being tested via a voltage-controlled amplifier and a series resistor. The voltage across the load is sensed, converted to DC, and is compared to a reference voltage. Any variation between the two voltages creates an error signal which causes the voltage controlled amplifier to adjust the voltage to the load as necessary in a manner so as to maintain a constant output voltage across the load. The apparent power consumed by the load is then directly proportional to the current through the load. The voltage across the series resistor, which is proportional to the current through it and through the load, is sensed, converted to DC, and applied to a meter which is calibrated in watts.

In a preferred embodiment of the test instrument, the AC signal is either from a built-in oscillator or from an external oscillator, a connector being provided for that purpose on the face of the instrument. A secondary meter and trimming control indicate the suitable range of operation for the oscillator output. The series resistor is a set of resistors which act as a range switch to permit a wide range of loads to be measured. The reference voltage is also switchable to permit the same meter scales to be used on 25 volt, 70 volt (nominal; actual voltage is $\sqrt{5000}$), and 140 volt (nominal, actually $\sqrt{20,000}$). Impedance scales, one corresponding to each reference voltage, calibrated in ohms, are also inscribed on the meter face. In addition to the AC-DC converter, the output of which drives the meter, a zero-adjust control and a "load null" control also drive the meter in a signal-summing arrangement. The "load null" control has the capability of manually nulling out any reading on the meter, up to and including exactly full scale. The purpose of the control, which is actually a specialized, one way zero-adjust control, is to allow the operator to ignore a load which cannot be removed from the line to be tested. In addition, full implementation of this control, which, to reiterate, will null out exactly full scale, allows measurement of normal full-scale reading on the left side of the meter, and double full-scale on the right, for example, 5-10 watts instead of the usual 0-5 watts. An overload indicator lights any time the output from the AC-DC converter to the meter exceeds twice the voltage which would normally cause full-scale deflection, or full-scale deflection with the "load null" control fully implemented, warning the operator to switch upscale on the range switch. Circuitry to the meter limits the actual current to slightly more than that required for full-scale deflection, and a similar limiting action below zero on the meter so no damage is possible to the meter movement regardless of the settings of the range switch or "load null" control.

A front-panel pushbutton marked "Ground Fault" disables the normal operation and converts the secondary meter, used in monitoring input level of the oscillator, to a conventional DC ohmmeter which measures the resistance between the test jack (both sides, high side and ground) and another terminal marked "System Ground" for resistance checking in a system where the speaker lines are normally floating and are not connected to ground in any way.

The unit is powered by either internal batteries or by an AC line by means of the front panel power switch. The unit is internally calibrated by switching across the test terminals resistors which correspond to a full-scale reading on each position of the reference-voltage switch. The actual calibration is made by adjusting the reference voltage to produce a full-scale reading.

BRIEF DESCRIPTION OF THE DRAWINGS

FIG. 3 is a detail of the preferred embodiment of the internal oscillator.

FIG. 4 is a detail of the preferred embodiment of the comparator/lamp driver.

FIG. 5 is a detail of the preferred embodiment of the controlled output amplifier.

FIG. 6 is a detail of the preferred embodiment of the monitoring meter amplifier.

DETAILED DESCRIPTION

In a distributed-load constant voltage audio distribution system the apparent power consumed in the system, its subsections, and components is of major importance. The apparent power is the product of the magnitude of the current and the voltage. Although, since the loads in such systems are principally resistive, the apparent power is close in value to the actual power consumed the measure of apparent power is more valuable because the amplifiers for such systems are generally current rather than strictly power limited capacity wise.

A system testing instrument 20 is provided which greatly simplifies the measurement of apparent power and complex impedance in such systems and its components. It permits the loads on installed systems to be conveniently determined at non-hazardous and non-destructive levels of test power in a simple manner. It further, in its preferred form, provides a rapid and convenient method of checking for and measuring ground faults in such constant voltage audio distribution systems.

PREFERRED EMBODIMENT

Figure 8:
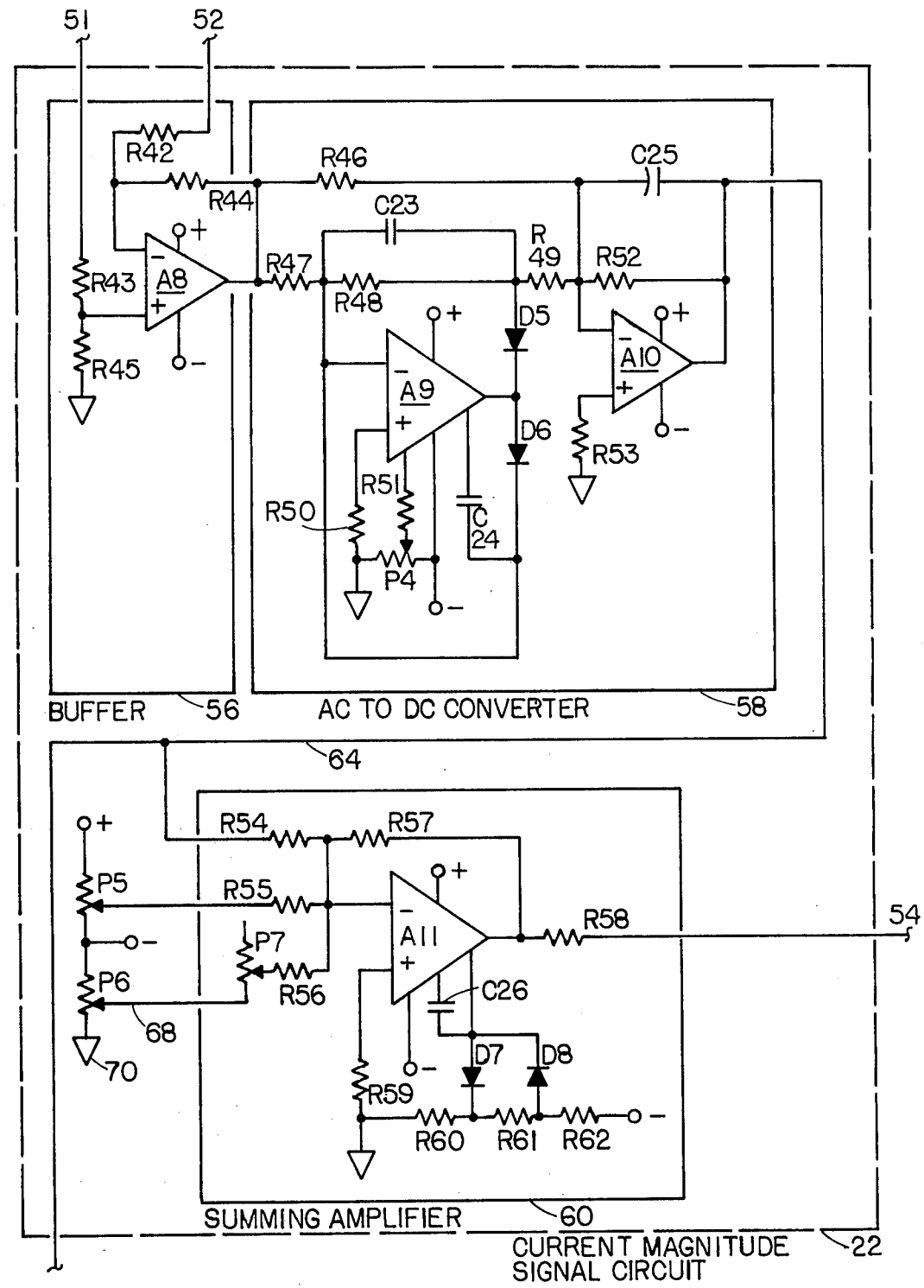
FIG. 8 is a detail of the preferred embodiment of the current magnitude signal circuit.
Figure 9:
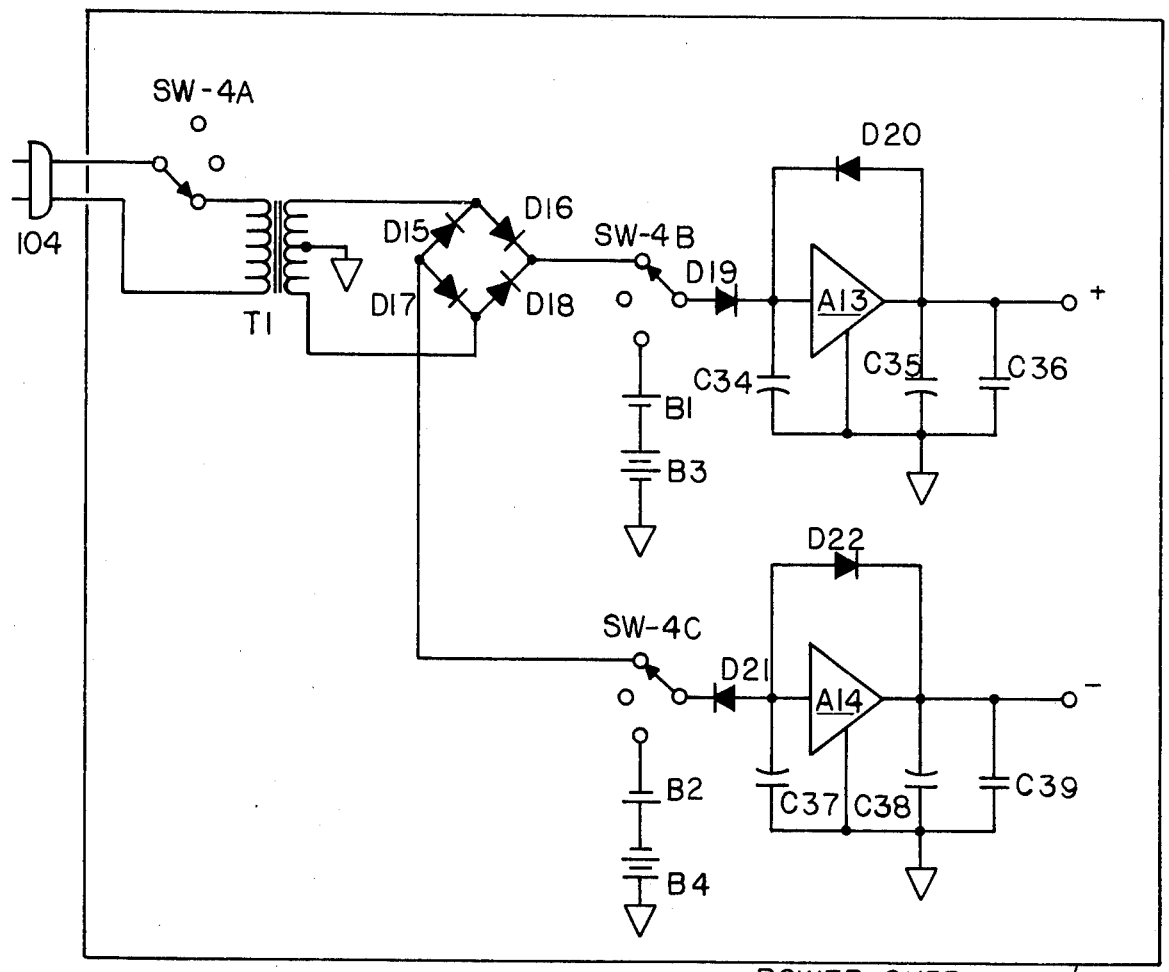
FIG. 9 is a detail of the preferred embodiment of the power supply.
Figure 10:
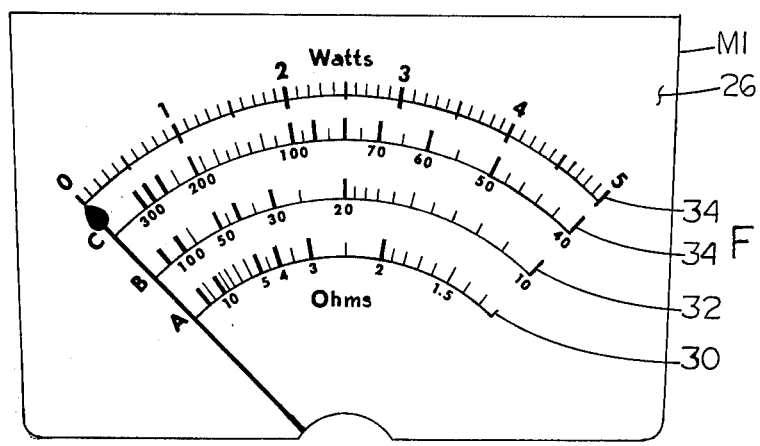
FIG. 10 is a detailed view of the face of the meter M1.

In its preferred form the constant voltage audio distribution system analyzer 20 has the configuration shown in FIGS. 1 through 10. The system analyzer 20 applies a controlled voltage audio signal to a distribution system or a portion thereof which is connected through a test connection, such as a connection jack J2, to the test subject. The current passing through the system or component passes through a resistance or preferably one of several resistances R23, R24, or R25 which correspond to different audio system voltages such as 25, 70 and 140 volts. The voltage across the resistance is monitored by a current magnitude signal circuit 22. The output of this circuit 24 is connected to an indicating device, such as an indicating meter M1 which is calibrated in watts of apparent power. The apparent power is proportional to the product of the applied voltage at the connection jack J2 and the current through the resistance R23, R24, or R25. Since the applied voltage is held at a constant value the apparent power is proportional to the current through the resistance. By appropriate linear scaling of the meter face 26 the wattage of apparent power may be read from the meter face. Scale range values 36 indicating full scale wattage value are provided to permit proper interpretation of the meter readings. In its preferred form, as shown in FIG. 10, there are additionally separate impedance scales 28, 30 and 32 which correspond to the resistances R23, R24 and R25 respectively which are selectively connected in series with the system under test. The impedance is the ratio of the applied voltage to the measured current.

To provide an audio frequency signal at which the test is to be conducted an external or internal oscillator 10 may be utilized. Preferably a provision, such as connection jack J1, is provided for connection of an external oscillator. It is preferred that an internal oscillator 38 be provided; and it may have, for example, an internal circuitry such as the conventional Twin-T circuitry illustrated in FIG. 3. The internal oscillator may be frequency variable or be of a fixed frequency such as 1000 Hz. Preferably the connector J1 for the connection of an external oscillator is of the common type which automatically disconnects the internal oscillator upon connection of the external oscillator. Voltage reduction control, such as a potentiometer P2, is preferably provided to permit adjustment of the magnitude of the audio frequency input. The audio frequency signal is applied to the input 40 of a controlled output amplifier 42. The controlled output amplifier provides a test signal at the input audio frequency at its output 44 at a magnitude which is dependent on the level of a signal applied to its control signal input 46. Preferably the controlled output amplifier consists of a voltage controlled amplifier 48 and a power amplifier 50. In its preferred form as shown in FIG. 5 the voltage controlled amplifier consists of an amplifier A1 having a voltage dividing network formed by resistors R9, R10, and R11. It further includes over-voltage protection provided by diodes D1 and D2 and D.C. voltage blocking capacitors C6, C7 and C11. The power amplifier may assume any conventional configuration, such as illustrated in FIG. 5, and preferably includes an isolation transformer T2 or other circuitry which reduces the output impedance of the amplifier to interface with an audio system having an impedance on the order of, for example, 8 ohms. The use of a power amplifier after and in conjunction with the voltage controlled amplifier permits the use of an oscillator and voltage controlled amplifier with low power output.

The resistances R23, R24 and R25 are selectively placed in series with the system to be tested using a switching device such as the five position switch SW-1. The function of the two additional positions will be described below.

In its preferred form diode pairs D25/D26 and D23/D24 are connected across the output connections 45 and 47 to provide overvoltage protection for the current magnitude signal circuit 22 and an error signal generator 49, described below.

The current magnitude signal circuit 22 monitors the voltage on inputs 51 and 52 across the series resistance, R23, R24, or R25 which is directly proportional to the current passing through the system being tested. It provides an output on connection 54 for driving an indicating device such as the meter M1. In its preferred form the current magnitude circuit 22 includes a buffer 56 which provides a high input impedance to the current magnitude circuit 22. This provides for accurate monitoring of the voltage across the resistance. The output of the buffer 56 is converted from AC to DC preferably by an RMS converter 58 as illustrated in FIG. 8. The converter provides a D.C. output which is porportional to the magnitude of the A.C. input from the buffer and is thus proportional to the current through the series resistance. The output 64 of the converter 58 provides a first input to a summing amplifier 60. A second input 62 is provided which consists of a variable voltage input, preferably formed by a potentiometer connected between the positive and negative terminals of a D.C. power supply. This provides a signal adjustment to permit zeroing the meter M1 when switch SW-1 is placed in a position to contact with conductor 66 and open the connection with the test circuit at jack J2. This short circuits the input to the current magnitude signal circuit 22 and provides a zero wattage reading condition.

It is not required but it is preferred that a third input 68 be provided to permit the offsetting of the indicating meter M1 reading by an adjustable amount. This provides a means whereby the meter reading may be adjusted to compensate for loads on the audio distribution system which cannot be isolated from that portion of the circuitry of interest. The input is connected to a potentiometer connected between a negative D.C. voltage supply and the system common 70. A potentiometer P7 is provided to permit the adjustment of the range of the offset. Preferably this is a full scale offset so that; for example, on a 0 – 5 watt scale, a wattage of up to 5 watts may be offset. This allows actual readings of 5 – 10 watts to be indicated on the meter face with the watts in excess of the offset amount readable directly on the meter face.

In its preferred form it is desired that the summing amplifier include circuitry such as that provided by diodes D7 and D8 and resistors R60, R61 and R62 to limit the output of the amplifier A11 to within a safe range for the meter M1.

As an additional feature of the preferred form of the test equipment, an overload indication is provided to notify the operator that a higher meter scale range should be selected on switch SW-1. The overload circuitry consists, in its preferred form, of a comparator/lamp driver 72 which has its input 74 connected to the output 64 of the A.C. to D.C. converter 58 of the current magnitude signal circuit 22. The output of the comparator/lamp driver illuminates a light such as the light emitting diode D14 when a predetermined signal level is achieved. The comparator/lamp driver 72, as shown in FIG. 4 preferably is adjusted to indicate when the meter range has been exceeded. Preferably where the nulling capability, as described above, has a value corresponding to a full scale reading, the overload warning is biased to light when a signal of a magnitude that is twice full scale is monitored. This avoids getting an overload signal when a signal within the scale range is received with a full scale value load nulled out.

Figure 1:
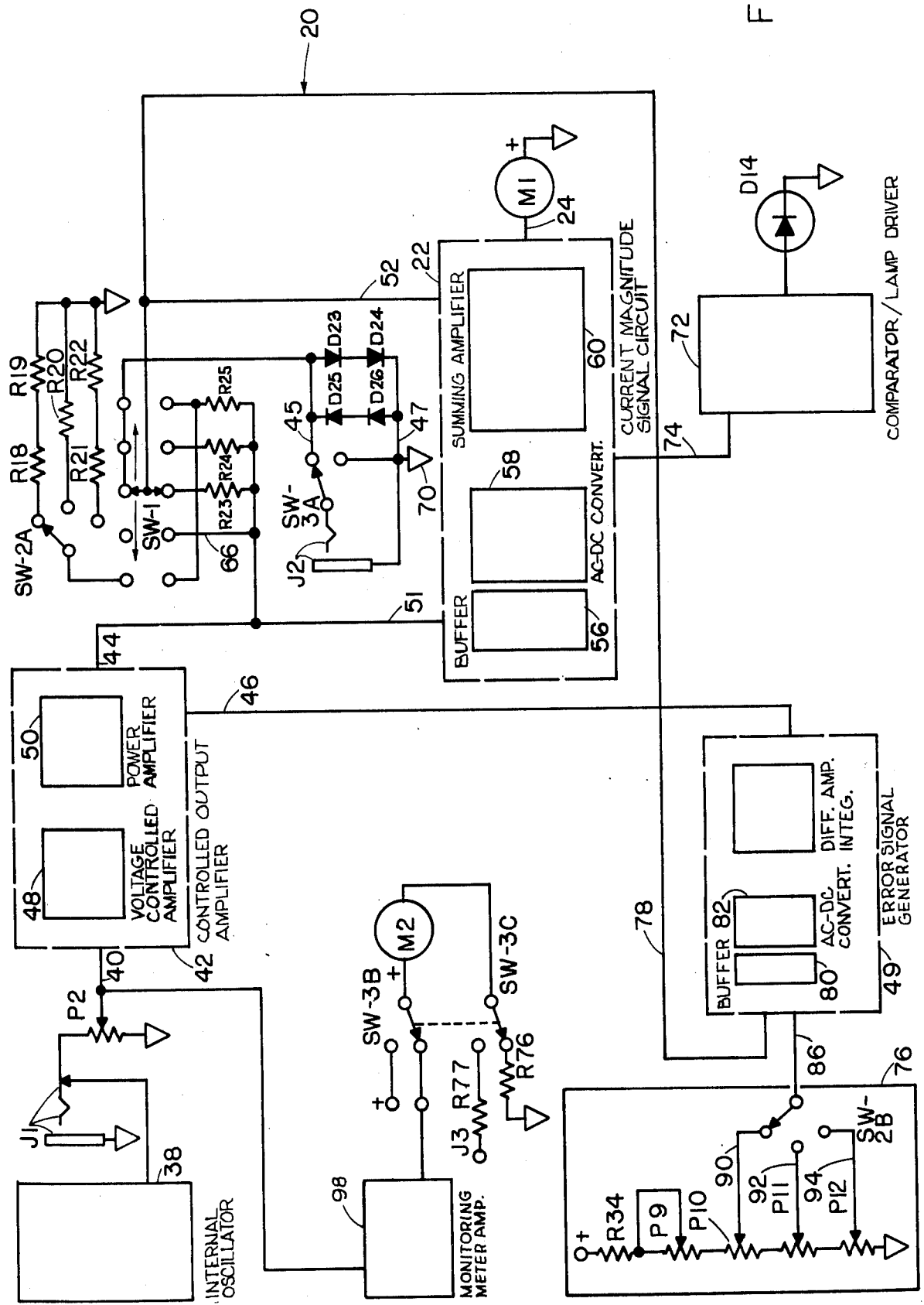
FIG. 1 is a schematic diagram of the preferred embodiment of the test instrument with some of the components shown in block form.
Figure 2:
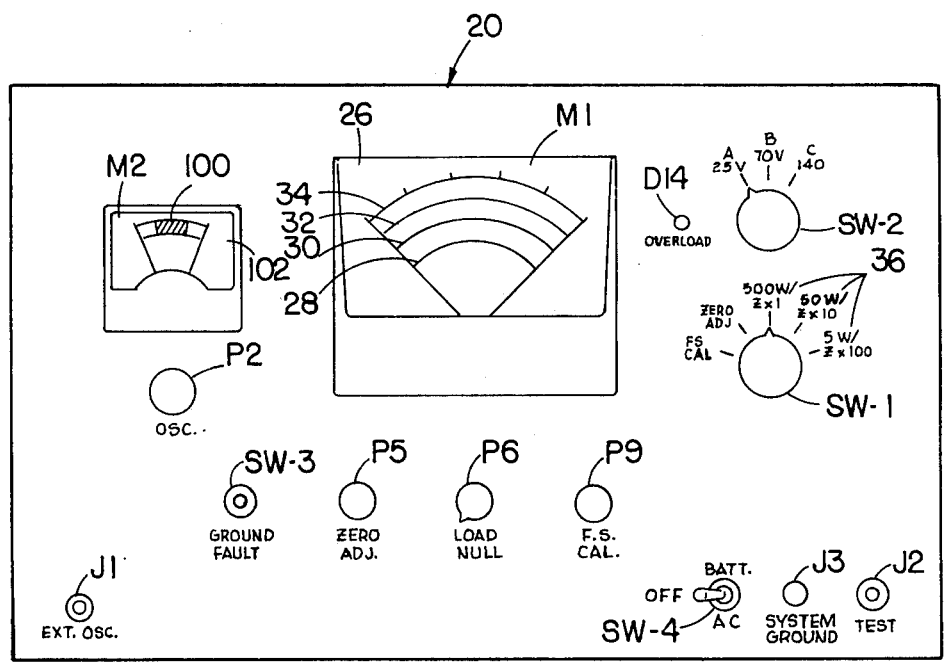
FIG. 2 is a front view of the preferred embodiment of the cabinet of the test instrument.
Figure 7:
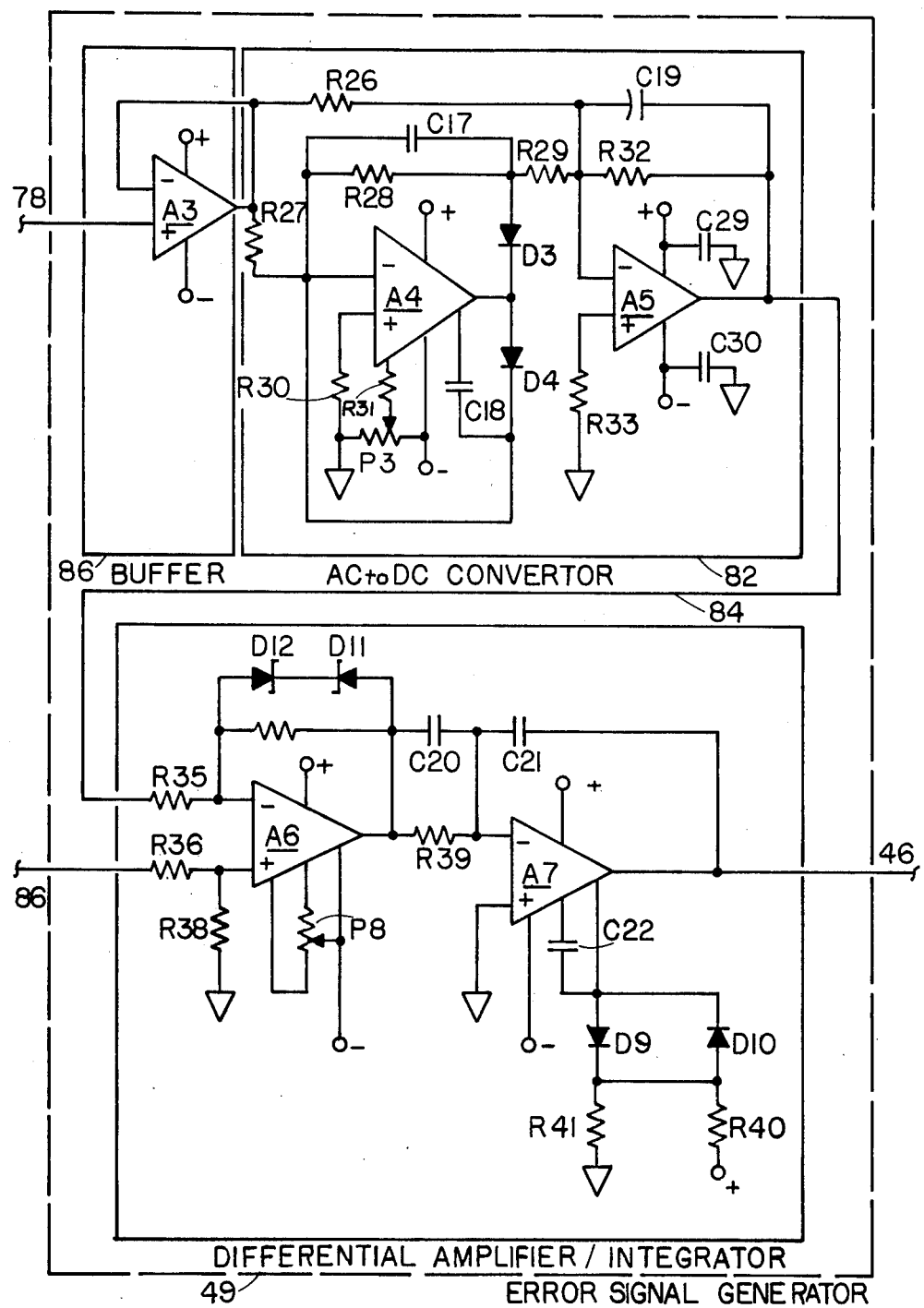
FIG. 7 is a detail of the preferred embodiment of the error signal generator.

The instrument 20 includes a feedback loop to the controlled amplifier control signal input 46 to maintain the desired test voltage at the output jack J-2. The loop could operate in its preferred form as shown in FIGS. 1 and 7. This consists of an error signal generator and a reference voltage supply 76. The error signal generator may consist simply of a differential amplifier 42 to its input 46 proportional to the amount by which the voltage on its input 78 varies from a desired value. In its preferred form the error signal generator 49 includes a buffer 80 which provides a high input impedance to avoid affecting the circuitry being monitored. The signal is then converted to D.C. by an RMS converter 82.

The output 84 of the converter 82 is a D.C. signal which is proportional to the RMS voltage applied to the circuit under test. The output 84 of the converter is applied to a differential amplifier consisting in its preferred form of amplifier A6 and its associated passive components R35, R36, R37, R38, D11 and D12. The diodes D11 and D12 are added to prevent the amplifier A6 from saturating, consequently resulting in a slow recovery. A reference voltage is supplied on conductor 86 from a reference voltage supply 76. The supply may consist of a voltage divider including a series of resistances R34, P9, P10, P11, P12 connectable to a voltage supply 88 having taps 90, 92, 94 which are selectively connectable by a switch SW-28 to conductor 86. The instrument 20 may thus be adapted for use with systems having different voltages such as 25, 70 or 140 volt systems. The output of the differential amplifier is coupled through C20 and R39 to an integrating circuit which is connected to the control signal input 46 of the controlled amplifier 42. This preferred integration processing of the differential amplifier output provides a more rapid and accurate voltage level control at the test output connection jack J2 but it may be omitted. In the preferred form of the circuitry diodes D9 and D10 are provided to limit the range of the integrator output to within the control range of amplifier A1 in the voltage controlled amplifier 48.

A fifth position to SW-1 is preferably provided to connect a resistance, whose value is selected through switch SW2A which is coupled operatively to SW-2B, to the output of the controlled output amplifier. The resistance has a value which gives a full scale wattage reading for the system voltage to which that position of switches SW-2A and SW-2B correspond. This permits the adjustment of the calibration potentiometer P9 to verify or insure an accurate meter M1 reading.

As an additional feature of the preferred form of the instrument 20 a monitoring meter M2 is connected through an appropriate interfacing circuit; such as the monitoring meter amplifier 98 to the controlled output amplifier 42. The monitoring meter amplifier 98 consists of a peak detector in series with and between two conventional amplifiers as shown in FIGS. 1 and 6. The meter M2 monitors and oscillator input signal level, whether from an external or internal source. A signal range 100 is marked on the face 102 to indicate that a signal is within a range in which the instrument is most accurate. Potentiometer P2 is used to vary the intput level accordingly.

The meter M2 in the preferred embodiment of the instrument 20 has a dual function. It is used to test for and measure ground faults in the circuitry under test. Operatively connected switches Sw-3B and SW-3C serve to connect the meter M2 in series with a voltage supply and the distribution system ground which is connected to terminal J3. Switch SW-3A, which is operatively connected to SW-3B and SW-3C, preferably a multi-contact, pushbutton switch, connects the conductors to the instrument common 70. This results in a potential being applied between the conductors of the circuit under test and ground. A ground fault completes the circuit through the meter M2. The magnitude of the fault resistance to ground may be read from the calibrated meter face 102.

Referring to FIG. 9, the preferred power supply 88 may assume the conventional form as shown . It provides power derived from either an external A.C. power connection 104 or internal batteries B1, B2, B3 and B4. The battery sources provide portability to the instrument 20.

OPERATIVE EXAMPLE OF THE PREFERRED EMBODIMENT

An operative instrument of the preferred configuration was constructed having the following circuit parameters and operational characteristics:

| | | |
|---|---|---|
| R1 | 4700 ohm | ¼W 5% composition |
| R2 | 180K | ¼W 5% composition |
| R3 | 18K | ¼W 5% composition |
| R4 | 18K | ¼W 5% composition |
| R5 | 4300 | ¼W 5% composition |
| R6 | 3300 | ¼W 5% composition |
| R9 | 82K | ¼W 5% composition |
| R10 | 10K | ¼W 5% composition |
| R11 | 18K | ¼W 5% composition |
| R12 | 100 | ¼W 5% composition |
| R13 | 22K | ¼W 5% composition |
| R14 | 330 | ¼W 5% composition |
| R15 | 330 | ¼W 5% composition |
| R16 | 10K | ¼W 5% composition |
| R17 | 15 | ¼W 5% composition |
| R18 | 2K | Metal Film Mil. No. RN60D 1% |
| R19 | 2K | Metal Film Mil. No. RN60D 1% |
| R20 | 1K | Metal Film Mil. No. RN60D 1% |
| R21 | 15 | Metal Film Mil. No. RN60D 1% |
| R22 | 110 | Metal Film Mil. No. RN60D 1% |
| R23 | 10 | Metal Film Mil. No. RN60D 1% |
| R24 | 100 | Metal Film Mil. No. RN60D 1% |
| R25 | 1K | Metal Film Mil. No. RN60D 1% |
| R26 | 20K | Metal Film Mil. No. RN60D 1% |
| R27 | 20K | Metal Film Mil. No. RN60D 1% |
| R28 | 20K | Metal Film Mil. No. RN60D 1% |
| R29 | 10K | Metal Film Mil. No. RN60D 1% |
| R30 | 15K | ¼W 5% composition |
| R31 | 5.1M | ¼W 5% composition |
| R32 | 221K | RN60D 1% |
| R33 | 6200 | ¼W 5% composition |
| R34 | 2700 | ¼W 5% composition |
| R35 | 10K | RN60D 1% |
| R36 | 10K | RN60D 1% |
| R37 | 100K | RN60D 1% |
| R38 | 100K | RN60D 1% |
| R39 | 100K | ¼W 5% composition |
| R40 | 3300 | ¼W 5% composition |
| R41 | 1600 | ¼W 5% composition |
| R42 | 100K | RN60D 1% |
| R43 | 100K | RN60D 1% |
| R44 | 1M | RN60D 1% |
| R45 | 1M | RN60D 1% |
| R46 | 20K | RN60D 1% |
| R47 | 20K | RN60D 1% |
| R48 | 20K | RN60D 1% |
| R49 | 20K | RN60D 1% |
| R50 | 15K | ¼W 5% composition |
| R51 | 5.1M | ¼W 5% composition |
| R52 | 110K | RN60D 1% |
| R53 | 6200 | ¼W 5% composition |
| R54 | 10K | RN60D 1% |
| R55 | 200K | ¼W 5% composition |
| R56 | 24K | ¼W 5% composition |
| R57 | 10K | RN60D 1% |
| R58 | 4.87K | RN60D 1% |
| R59 | 4300 | ¼W 5% composition |
| R60 | 1K | ¼W 5% composition |
| R61 | 2K | ¼W 5% composition |
| R62 | 10K | ¼W 5% composition |
| R63 | 270 | ¼W 5% composition |
| R64 | 680 | ¼W 5% composition |
| R65 | 1M | ¼W 5% composition |
| R66 | 1M | ¼W 5% composition |
| R67 | 1K | ¼W 5% composition |
| R68 | 100K | ¼W 5% composition |
| R69 | 2M | ¼W 5% composition |
| R70 | 1M | ¼W 5% composition |
| R71 | 10M | ¼W 5% composition |
| R72 | 1M | ¼W 5% composition |
| R73 | 1M | ¼W 5% composition |
| R74 | 1M | ¼W 5% composition |
| R75 | 1M | ¼W 5% composition |
| R76 | 5100 | ¼W 5% composition |
| R77 | 15K | ¼W 5% composition |
| C1 | .1 mfd | 25V disc ceramic |
| C2 | .02 mfd | 1KV disc ceramic |
| C3 | .01 mfd | 1KV disc ceramic |
| C4 | .01 mfd | 1KV disc ceramic |
| C5 | .1 mfd | 25V disc ceramic |
| C6 | 1 mfd | 35V solid tantalum |
| C7 | 1 mfd | 35V solid tantalum |
| C8 | .01 mfd | 1KV disc ceramic |

-continued

| | | |
|---|---|---|
| C9 | 500 pf | 1KV disc ceramic |
| C10 | .1 mfd | 25V disc ceramic |
| C11 | 10 mfd | 20V solid tantalum |
| C12 | 100 mfd | 16V electrolytic |
| C13 | 100 mfd | 4V solid tantalum |
| C14 | 100 mfd | 16V electrolytic |
| C15 | .01 mfd | 1KV disc ceramic |
| C16 | 22 pf | 1KV disc ceramic |
| C17 | 10 pf | 1KV disc ceramic |
| C18 | 150 pf | 1KV disc ceramic |
| C19 | 1 mfd | 35V solid tantalum |
| C20 | .1 mfd | 25V disc ceramic |
| C21 | 5 mfd | 25V mylar |
| C22 | 30 pf | 1KV disc ceramic |
| C23 | 10 pf | 1KV disc ceramic |
| C24 | 150 pf | 1KV disc ceramic |
| C25 | 1 mfd | 35V solid tantalum |
| C26 | 30 pf | 1KV disc ceramic |
| C27 | .01 mfd | 1 KV disc ceramic |
| C28 | .01 mfd | 1 KV disc ceramic |
| C29 | .01 mfd | 1 KV disc ceramic |
| C30 | .01 mfd | 1 KV disc ceramic |
| C31 | .1 mfd | 25V disc ceramic |
| C32 | .1 mfd | 25V disc ceramic |
| C33 | .1 mfd | 25V disc ceramic |
| C34 | 1500 mfd | 25V electrolytic |
| C35 | 100 mfd | 16V electrolytic |
| C36 | .1 mfd | 25V disc ceramic |
| C37 | 1500 mfd | 25V electrolytic |
| C38 | 100 mfd | 16V electrolytic |
| C39 | .1 mfd | 25V disc ceramic |
| P1 | 10K | cermet trimpot |
| P2 | 25K | 2W comp. panel mtg. |
| P3 | 50K | cermet trimpot |
| P4 | 50K | cermet trimpot |
| P5 | 50K | 2W comp. panel mtg. |
| P6 | 5K | 2W comp. panel mtg. |
| P7 | 10K | cermet trimpot |
| P8 | 10K | cermet trimpot |
| P9 | 10K | 2W comp. panel mtg. |
| P10 | 5K | cermet trimpot |
| P11 | 2K | cermet trimpot |
| P12 | 200 | cermet trimpot |
| D1 | 1N914 | |
| D2 | 1N914 | |
| D3 | 1N914 | |
| D4 | 1N914 | |
| D5 | 1N914 | |
| D6 | 1N914 | |
| D7 | 1N914 | |
| D8 | 1N914 | |
| D9 | 1N914 | |
| D10 | 1N914 | |
| D11 | 1N4740 | |
| D12 | 1N4740 | |
| D13 | 1N914 | |
| D14 | | Industrial Devices LED B4300S3 |
| D15 | 1N4001 | |
| D16 | 1N4001 | |
| D17 | 1N4001 | |
| D18 | 1N4001 | |
| D19 | 1N4001 | |
| D20 | 1N4001 | |
| D21 | 1N4001 | |
| D22 | 1N4001 | |
| D23 | 1N457A | |
| D24 | 1N475A | |
| D25 | 1N457A | |
| D26 | 1N457A | |
| A1 | MFC6040 | (MC3340P) Motorola |
| A2 | NE540 | Signetics |
| A3 | MC1741 | Motorola |
| A4 | LM301A | National Semiconductor, Inc. |
| A5 | MC1741 | Motorola |
| A6 | MC1741 | Motorola |
| A7 | LM301A | National Semiconductor, Inc. |
| A8 | MC1741 | Motorola |
| A9 | LM301A | National Semiconductor, Inc. |
| A10 | MC1741 | Motorola |
| A11 | LM301A | National Semiconductor, Inc. |
| A12 | LM3900 | National Semiconductor, Inc. |
| A13 | MC7815 | CP Motorola |
| A14 | MC7915 | CP Motorola |
| Q1 | 2N3711 | Texas Instrument |
| Q2 | 2N3711 | Texas Instrument |
| M1 | | 0–1 ma DC 4½" |
| M2 | | 0–1 ma DC 2½" |
| B1 | 1.5V | Zinc-carbon NEDA size C |
| B2 | 1.5V | Zinc-carbon NEDA size C |
| B3 | 22½V | Zinc-carbon NEDA type 710 |
| B4 | 22½V | Zinc-carbon NEDA type 710 |

T1 115 V AC to 30VCT at 150 ma
T2 500 ohm to 8 ohm miniature transistor output
A.C. input: 120 V.A.C.

-continued

+ voltage: + 15 V.D.C.
− voltage: − 15 V.D.C.
Test signal frequence range — 20 Hz to 30K Hz;
100 Hz to 20K Hz with good accuracy
Internal oscillator frequency: 1000 Hz
Test voltage corresponding to 25 volts: 12.5 mv
Test voltage corresponding to 70 volts: 100 mv
Test voltage corresponding to 140 volts: 400 mv

ADVANTAGES OF THE INVENTION

Utilizing the preferred embodiment of the test instrument service personnel can rapidly test and trouble shoot problems in distributed-load, constant voltage audio distribution systems. All or part of a system can be rapidly tested for impedance and power consumption. The instrument is normally connected to the system in place of the amplifier, but it can be connected to branch sub-systems or individual system components. The system operates at low voltage levels so that the systems, such as those in schools may be tested without exposing people present to hazardous voltage potentials. Loads which cannot be removed from a system to permit testing of only those components of interest can be nulled out of the instrument readings conveniently. The instrument is able to test constant voltage systems of several different voltage values and it is also portable, being operable from line A.C. or internal battery power sources. The instrument is capable of using an internal or external audio signal source so that the effects of the system or components on different frequency signals may be determined. Furthermore, the systems and components being tested may be tested for the presence and magnitude of ground faults on the same instrument by simply pushing a button.

I claim:

1. A test instrument for determining apparent power consumption in various portions of a distributed-load, constant-voltage audio distribution system, comprising:
   a. a controlled output amplifier having an input for receiving an audio input signal of a frequency at which the apparent power consumption is to be tested, a control signal, input, and an output which controlled amplifier produces an output signal at the test frequency of a voltage dependent on the magnitude of the signal received at the control signal input;
   b. a resistance;
   c. means for connecting the resistance to the output of the controlled amplifier;
   d. means for connecting the resistance to that portion of the distributed-load, constant-voltage audio distribution system to be tested so that a test signal is applied to the portion of the system to be tested and the current that passes through the resistance is substantially equivalent to that which passes through that portion of the system to be tested;
   e. means for supplying a reference voltage signal having a magnitude corresponding to the voltage at which the apparent power consumption is to be determined;
   f. means, having inputs connected to the reference voltage supply means and the audio distribution system connection means and an output which is connected to the control signal input of the controlled amplifier, for producing an error signal at the output so that a test signal of a voltage corresponding to the voltage at which the apparent power consumption is to be determined is applied to the circuit under test at the audio distribution system connection means;

g. means connectable across the resistance for producing a signal having a magnitude indicative of the amount of current passing through the resistance; and h. means connected to the current magnitude signal means for indicating the magnitude of the current passing through the resistance which indication is indicative of the apparent power consumed by the tested system.

2. A test instrument for determining apparent power consumption in various portions of a distributed-load, constant-voltage audio distribution system, as claimed in claim 1, wherein the reference voltage supply means comprises a resistance connectable to a power supply, having a plurality of taps which are proportional to different voltages at which the apparent power consumption is to be determined and a means for selectively connecting the taps to the error signal means so that the power consumption may be determined by using a single test instrument on systems and components of systems which operate at different voltage levels.

3. A test instrument for determining apparent power consumption in various portions of a distributed-load, constant-voltage audio distribution system, as claimed in claim 2, wherein the indicating means has a plurality of scales calibrated in ohms corresponding to the different voltage taps of the reference voltage supply means so that the impedance of the circuit being tested is indicated directly without the need for mathematical computations.

4. A test instrument for determining apparent power consumption in various portions of a distributed-load, constant-voltage audio distribution system, as claimed in claim 3, wherein the error signal means comprises a connection to the input of the controlled amplifier having an integrator to increase the sensitivity of voltage level control.

5. A test instrument for determining apparent power consumption in various portions of a distributed-load, constant-voltage audio distribution system, as claimed in claim 4, wherein the error signal means comprises a connection to the audio distribution connection means including an AC to DC converter.

6. A test instrument for determining apparent power consumption in various portions of a distributed-load, constant-voltage audio distribution system, as claimed in claim 5, wherein error signal means connection to the audio distribution connection means includes a buffer having a high input impedance to minimize the effect on the signal applied to the circuit under test.

7. A test instrument for determining apparent power consumption in various portions of a distributed-load, constant-voltage audio distribution system, as claimed in claim 1, wherein the current magnitude signal means comprises an AC to DC converter.

8. A test instrument for determining apparent power consumption in various portions of a distributed-load, constant-voltage audio distribution system, as claimed in claim 7, wherein the current magnitude signal means comprises, in addition, a buffer connected between the AC to DC converter and the resistance having a high input resistance to minimize the effect on the signal applied to the circuit under test.

9. A test instrument for determining apparent power consumption in various portions of a distributed-load, constant-voltage audio distribution system, as claimed in claim 8, wherein the current magnitude signal means is connected to the indication means through a summing amplifier having a first input connected to the output of the AC to DC converter, a second input for connection to a variable DC voltage supply to provide a zero signal level adjustment and comprising, in addition, a switch for selectively shorting the input to the current magnitude signal means to permit a zero signal level adjustment to be made.

10. A test instrument for determining apparent power consumption in various portions of a distributed-load, constant-voltage audio distribution system, as claimed in claim 9, wherein the summing amplifier has a third input for connection to a variable DC voltage supply to permit the nulling of a fixed load in the system under test so that the indication means will not include an indication of the apparent power consumed in a portion of the circuit under test which is not of interest but cannot be separated from the portion of interest.

11. A test instrument for determining apparent power consumption in various portions of a distributed-load, constant-voltage audio distribution system, as claimed in claim 1, wherein the controlled amplifier comprises a voltage controlled amplifier in series with a power amplifier.

12. A test instrument for determining apparent power consumption in various portions of a distributed-load, constant-voltage audio distribution system, as claimed in claim 11, wherein the output of the controlled amplifier is connected to the resistance through an isolation transformer.

13. A test instrument for determining apparent power consumption in various portions of a distributed-load, constant-voltage audio distribution system, as claimed in claim 1, comprising in addition an internal oscillator connectable to the controlled amplifier for supplying an audio frequency test signal input.

14. A test instrument for determining apparent power consumption in various portions of a distributed-load, constant-voltage audio distribution system, as claimed in claim 13, comprising in addition a means for connecting an external oscillator to the controlled amplifier to supply an audio frequency signal and disconnecting the internal oscillator.

15. A test instrument for determining apparent power consumption in various portions of a distributed-load, constant-voltage audio distribution system, as claimed in claim 1, comprising in addition a means, connected to the input of the controlled amplifier for varying the magnitude of the audio frequency input to the controlled amplifier, a monitoring circuit connected to the input of the controlled amplifier including an indicating meter to facilitate adjustment of the audio frequency input signal to a range best suited for the test instrument.

16. A test instrument for determining apparent power consumption in various portions of a distributed-load, constant-voltage audio distribution system, and for detecting ground faults in distributed-load constant-voltage systems as claimed in claim 15, comprising in addition a means for applying a potential between ground and the conductors of the distributed-load, constant-voltage system, including a means for connecting the indicating meter in series to indicate any leakage current which would indicate a ground fault.

17. A test instrument for determining the apparent power consumption in various portions of a distributed-load, constant-voltage audio distribution system, comprising:
- a. a controlled output amplifier having a voltage controlled amplifier having an input for receiving an audio input signal of a frequency at which the apparent power consumption is to be tested and a control signal input; a power amplifier having its input connected to the output of the voltage controlled amplifier; and an isolation transformer having its primary connection to the output of the power amplifier so that an isolated audio frequency signal is produced at its secondary with a voltage magnitude that is dependent on the magnitude of a signal received at the control input of the voltage controlled amplifier.
- b. a plurality of resistances corresponding to different levels of apparent power consumption;
- c. means for selectively connecting the resistances between that portion of the distributed-load, constant-voltage distribution system to be tested and the secondary of the isolation transformer so that a test signal is applied to that portion under test and the current that passes through the resistance is substantially equivalent to that which passes through that portion of the system being tested;
- d. means for supplying a reference voltage signal having a magnitude corresponding to the voltage at which the apparent power consumption is to be determined including a resistance having a plurality of taps proportional to different voltage levels utilized in such systems to form a voltage divider;
- e. an error signal generator having a buffer having its input connected to the audio distribution system connection means to monitor the voltage level of the audio frequency test signal applied to that portion of the circuit being tested and to isolate it and minimize the effect of the monitoring; an RMS converter connected to the output of the buffer to generate a DC signal having a magnitude which corresponds to the magnitude of the test signal; a differential amplifier having one input connected to the output of the RMS converter and one input connected to the reference voltage supply means producing an output signal having a magnitude which corresponds to the amount by which the test signal varies from the desired voltage; and an integrator having its input connected to the output of the differential amplifier and its output connected to the control signal input of the voltage controlled amplifier to rapidly adjust the voltage level of the test signal to a desired level;
- f. a current signal generator having a buffer having its input connected to the connection means to monitor the current through the resistance to isolate the resistance and minimize the effect of monitoring; an RMS converter having its input connected to the output of the buffer; a first means for supplying a variable DC voltage; a second means for supplying a variable DC voltage; a summing amplifier having a first input connected to the output of the RMS-converter, a second input connected to the first DC supply means to provide a signal level adjustment, and a third input connected to the second DC supply means to provide a load nulling capability;
- g. an indicator connected to the output of the summing amplifier to indicate the apparent power consumed by the portion of the system under test which is directly related to the current through the resistance.

18. A test instrument for determining apparent power consumption in various portions of a distributed-load, constant-voltage distribution audio distribution system and for detecting ground faults in distributed-load, constant-voltage systems, as claimed in claim 17, comprising, in addition, an internal oscillator connectable to the controlled amplifier for supplying an audio frequency, means for connecting an external oscillator to the controlled amplifier and disconnecting the internal oscillator; a monitoring circuit connected to the input of the controlled amplifier including a meter to indicate the level of the oscillator signal; means for applying a potential between ground and the conductors of the distributed-load, constant-voltage system, including a switch for connecting the meter in series to indicate any leakage current which would indicate a ground fault.

* * * * *